United States Patent
Loncar et al.

(10) Patent No.: US 8,999,105 B2
(45) Date of Patent: Apr. 7, 2015

(54) SMALL-SCALE FABRICATION SYSTEMS AND METHODS

(71) Applicant: President and Fellows of Harvard College, Cambridge, MA (US)

(72) Inventors: Marko Loncar, Belmont, MA (US); Mikhail D. Lukin, Cambridge, MA (US); Michael J. Burek, Somerville, MA (US); Nathalie de Leon, Somerville, MA (US); Brendan Shields, Somerville, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 14/370,107

(22) PCT Filed: Jan. 4, 2013

(86) PCT No.: PCT/US2013/020322
§ 371 (c)(1),
(2) Date: Jul. 1, 2014

(87) PCT Pub. No.: WO2013/147966
PCT Pub. Date: Oct. 3, 2013

(65) Prior Publication Data
US 2014/0367687 A1 Dec. 18, 2014

Related U.S. Application Data

(60) Provisional application No. 61/583,663, filed on Jan. 6, 2012.

(51) Int. Cl.
*H05H 1/00* (2006.01)
*H01L 21/683* (2006.01)
(Continued)

(52) U.S. Cl.
CPC ............ *H01L 21/3065* (2013.01); *G02B 6/136* (2013.01); *G02B 6/1225* (2013.01);
(Continued)

(58) Field of Classification Search
CPC . H01L 21/3065; H01L 21/027; H01L 21/308; H01L 29/04; H01L 29/0665
USPC ........ 156/345.48, 345.49; 257/49, 52, 77, 89, 257/618, E21.549, E21.572, E33.006; 438/694, 719, 758
See application file for complete search history.

(56) References Cited

U.S. PATENT DOCUMENTS 5,362,353 A 11/1994 Mallon
6,120,597 A 9/2000 Levy et al.
(Continued)

FOREIGN PATENT DOCUMENTS

JP 2003243362 8/2003
KR 10-2007-0018585 2/2007

OTHER PUBLICATIONS

Bayn et al., "Triangular Nanobeam Photonic Cavities in Single-Crystal Diamond," New Journal of Physics 13, (2011) pp. 1-13.
(Continued)

*Primary Examiner* — Dao H Nguyen
(74) *Attorney, Agent, or Firm* — Occhiuti & Rohlicek LLP (57) ABSTRACT

An etch mask is formed on a substrate. The substrate is positioned in an enclosure configured to shield an interior of the enclosure from electromagnetic fields exterior to the enclosure; and the substrate is etched in the enclosure, including removing a portion of the substrate to form a structure having at least a portion that is isolated and/or suspended over the substrate.

24 Claims, 8 Drawing Sheets (51) Int. Cl.
*H01L 33/00* (2010.01)
*H01L 21/3065* (2006.01)
*G02B 6/136* (2006.01)
*H01J 37/32* (2006.01)
*H01L 21/027* (2006.01)
*H01L 21/308* (2006.01)
*H01L 29/04* (2006.01)
*H01L 29/06* (2006.01)
*G02B 6/122* (2006.01)

(52) U.S. Cl.
CPC ..... *H01J 37/32577* (2013.01); *H01J 37/32651* (2013.01); *H01J 37/32715* (2013.01); *H01J 2237/0266* (2013.01); *H01J 2237/2007* (2013.01); *H01J 2237/334* (2013.01); *H01J 2237/3341* (2013.01); *H01L 21/027* (2013.01); *H01L 21/308* (2013.01); *H01L 29/04* (2013.01); *H01L 29/0665* (2013.01)

(56) References Cited

U.S. PATENT DOCUMENTS

| | | | | |
|---|---|---|---|---|
| 6,447,636 | B1* | 9/2002 | Qian et al. | 156/345.48 |
| 6,551,944 | B1 | 4/2003 | Fallica et al. | |
| 6,673,199 | B1* | 1/2004 | Yamartino et al. | 156/345.49 |
| 2010/0167186 | A1 | 7/2010 | Jang et al. | |
| 2012/0273130 | A1* | 11/2012 | Drewery et al. | 156/345.3 |
| 2014/0191236 | A1* | 7/2014 | Nuzzo et al. | 257/49 |
| 2014/0262043 | A1* | 9/2014 | Frazier et al. | 156/345.48 |

OTHER PUBLICATIONS

Burek et al., "Free-Standing Mechanical and Photonic Nanostructures in Single-Crystal Diamond," Nano Lett., 2012, 12, 6084-6089.

Lee et al., "Oblique-Directional Plasma Etching of Si Using a Faraday Cage," Journal of the Electrochemical Society, 156 (7) D222-D225 (2009).

Min et al., "Improvement of $SiO_2$ Pattern Profiles Etched in $CF_4$ and $SF_6$ Plasmas by Using a Faraday Cage and Neutral Beams," Surface and Coatings Technology, 193 (2005) 75-80.

Quan et al., "Deterministic Design of Wavelength Scale, Ultra-High Q Photonic Crystal Nanobeam Cavities," Opt. Express, 15, 4694-4704 (2007).

Ryu et al., "Trajectories of Ions Inside a Faraday Cage Located in a High Density Plasma Etcher," Korean J. Chem. Eng., 20(2), 407-413 (2003).

Volkert et al., "Focused Ion Beam Microscopy and Micromachining," Mrs. Bulletin, vol. 32, May 2007, 389-399.

* cited by examiner

SMALL-SCALE FABRICATION SYSTEMS AND METHODS

CROSS-REFERENCE TO RELATED APPLICATIONS

This application is a National Stage of International Application No. PCT/US2013/020322 filed on Jan. 4, 2013 which claims the benefit of U.S. Provisional Application No. 61/583,663, filed Jan. 6, 2012, the contents of which are incorporated herein by reference.

STATEMENT AS TO FEDERALLY SPONSORED RESEARCH

This invention was made with government support under HR0011-11-C-0073 awarded by U.S. Department of Defense. The government has certain rights in the invention.

BACKGROUND

This description relates to small-scale fabrication systems and methods.

Suspended structures can be fabricated for a variety of photonic, mechanical, and optomechanical elements such as beams, waveguides, ring and disk resonators, membranes, and high quality factor (Q-factor) electromagnetic cavities. The suspended device architecture is useful for applications that demand mechanical degrees of freedom or optical isolation from the environment, which may be a requirement, for example, in the fabrication of both optical and mechanical resonators. Some fabrication techniques for suspended structures are limited to specific material systems.

There is particular interest in photonic devices with dimensions comparable to the wavelength of light. With mode areas (A) and volumes (V) close to the fundamental diffraction limit, $A=(\lambda/2n)^2$ and $V=(\lambda/2n)^3$ respectively, these photonic devices have enabled the engineering of strong light-matter interactions and numerous emerging applications such as ultrasmall lasers, optomechanical devices, optical switching, and chemical sensing. Many practical applications require the operating frequency of the device to be in the ultraviolet to near infrared range. Thus, the critical device dimensions are on the nanometer and sub-micron scales. One strategy for achieving guiding, confinement, and manipulation of light is to fabricate nanometer and sub-micron scale suspended beam device architectures (also referred to as nanobeams). In a suspended nanobeam, light is guided and confined to the beam due to the refractive index contrast between the nanobeam material and the surrounding medium (typically air). A suspended nanobeam may be patterned into a one-dimensional lattice to generate a photonic band gap material, and photonic crystal cavities can be defined from such structures by introduction of a defect. Such nanobeam photonic crystal cavities (also referred to as nanobeam cavities) have exceptional figures of merit (i.e. ultra high Q-factor with ultra small mode volumes). These simple structures rival the best two-dimensional planar photonic crystal cavities in reported and theoretical Q/V values. Moreover, the evanescent field in these suspended nanobeam cavities decays from all facets of the beam, which should facilitate sensing and biosensing applications as well as techniques for the dynamic control of cavity resonances.

To date, suspended nanobeam waveguides and cavities, along with nanomechanical resonant structures, have been demonstrated in a variety of materials systems used in the integrated circuit and optoelectronic industries, including silicon, silicon oxide, silicon nitride, and III-V semiconductors. Such suspended structures can be fabricated by surface nanomachining techniques. For example, surface nanomachining may begin with a heterostructure comprising structural (top) and sacrificial (middle) layers (of different materials) supported by a substrate (bottom). An etch mask is defined on top of the structural layer using deposition, lithography, and pattern transfer techniques. The pattern defined by the etch mask is then transferred into the device and sacrificial layers using a top down anisotropic (i.e., sensitive to direction) etch. After removal of the etch mask, the sacrificial layer under the structure is removed using a selective (i.e., sensitive to different materials) and isotropic (i.e., insensitive to direction) etch, which results in a free-standing structure. Similar techniques can also be used in the fabrication of micron and nanoscale ring and disk resonators. A prerequisite for employing surface nanomachining is the thin film heterolayer structure described, such that an isotropic etch may realize free-standing structures. In the case of material systems like silicon-on-insulator (SOI), gallium arsenide/aluminum arsenide (GaAs/AlGaAs), or amorphous silicon nitride on silicon, fabrication of a heterolayer structure is typically possible due to well-developed thin film chemical vapor deposition techniques.

SUMMARY

In a general aspect, a method includes forming an etch mask on a substrate; etching the substrate through the etch mask from at least a first direction having a first angle relative to a surface of the substrate, including removing a first portion of the substrate; positioning the substrate in an enclosure configured to shield an interior of the enclosure from electromagnetic fields exterior to the enclosure; and etching the substrate in the enclosure through the etch mask from at least a second direction having a second angle, different from the first angle, relative to the surface of the substrate, including removing a second portion of the substrate to form a structure having at least a first portion of the structure suspended over the substrate.

Embodiments may include one or more of the following.

The enclosure is a Faraday cage.

Etching the substrate in the enclosure includes performing an anisotropic plasma etch of the substrate. Etching the substrate in the enclosure includes performing the anisotropic plasma etch from at least a third direction having a third angle relative to the surface of the substrate. The second angle and the third angle are defined by a geometry of the enclosure. The second direction is different from the third direction, and the second angle is approximately equal to the third angle. The anisotropic plasma etch includes at least one of a plasma etch, a reactive ion etch, a high density plasma etch, and a sputter etch.

Etching the substrate through the etch mask from at least the first direction includes performing a top-down plasma etching to pattern the substrate with a pattern defined by the etch mask. Etching the substrate in the enclosure through the etch mask from at least the second direction includes etching the patterned substrate in the enclosure.

The second angle relative to the surface of the substrate is selected to form, in a portion of the first portion of the structure, a shape having a triangular cross-section with an apex directed toward the substrate.

A dimension of the first portion of the structure is at least about 10 nm.

The structure includes at least one of a mechanical resonator, an optical resonator, an optical waveguide, and a photonic crystal.

The substrate includes at least one of a single crystal bulk substrate, a polycrystalline substrate, and an amorphous substrate. The substrate may be a film having a thickness greater than a thickness of the structure. The substrate may consist essentially of diamond.

The method further includes removing the etch mask.

In another general aspect, a fabrication system includes a plasma etch system; a conductive enclosure configured to shield an interior of the enclosure from electromagnetic fields exterior to the enclosure; and a sample holder disposed within the enclosure, the plasma etch system configured to etch a sample positioned on the sample holder from more than two different directions based on a geometry of the enclosure.

Embodiments may include one or more of the following.

The enclosure is a Faraday cage.

The enclosure is electrically connected to a cathode of the plasma etch system.

The plasma etch system includes at least one of a plasma etcher, a reactive ion etcher, a high density plasma etcher, and a sputter etcher.

The enclosure is formed from a material capable of withstanding etch conditions of the plasma etch system.

The geometry of the enclosure is selected based on a target geometry of a structure to be etched in the sample.

The geometry of the enclosure is a pyramid having a polygonal base and triangular sides formed by each base edge and a common apex.

The geometry of the enclosure is conical.

In another general aspect, a structure includes a substrate; and a structure formed over the substrate and formed of the same material as the substrate, the structure having at least a first portion of the structure that is isolated from any of the material of the substrate, over a first plane, by more than twice the minimum diameter of the cross-section of the first portion in the first plane.

Embodiments may include one or more of the following.

The first portion of the structure is suspended over the substrate.

The structure includes at least one of a mechanical resonator, an optical resonator, an optical waveguide, and a photonic crystal.

A dimension of the first portion of the structure is at least about 10 nm.

The substrate includes at least one of a single crystal bulk substrate, a polycrystalline substrate, and an amorphous substrate. The substrate may be a film having a thickness greater than a thickness of the structure. The substrate may consist essentially of diamond.

A crystalline integrity of the substrate is substantially the same as a crystalline integrity of the structure.

Among other advantages, the systems and methods described herein enable the fabrication of free-standing three-dimensional nano-scale or micro-scale mechanical and optical devices. These devices can be fabricated without the introduction of defects, stress, or other damage to the devices and thus without compromising the final performance of the devices. Devices may be fabricated from any of a large range of materials having attractive optical, electro-optic, piezoelectric, quantum optical, or other properties, for example. In addition, the systems and methods described herein make use of advanced pattern transfer techniques that have high throughput and good inter-device reproducibility.

Other features and advantages of the invention are apparent from the following description, and from the claims.

DESCRIPTION

There are a variety of materials with attractive optical, electro-optic, piezoelectric, quantum optical, and other properties for which high optical quality supported thin film heterolayers are not available for performing certain surface nanomachining techniques. Examples include complex metal oxides like lithium niobate ($LiNbO_3$), lithium tantalate ($LiTaO_3$), potassium tantalate ($KTaO_3$), strontium titanate ($SrTiO_3$), and barium titanate ($BaTiO_3$), silicon based materials such as silicon carbide (SiC), III-V semiconductors like gallium nitride (GaN), and inert single-crystals such as diamond. Materials like diamond and SiC are particularly attractive due to their wide optical band gaps and well-documented luminescent defects such as the nitrogen vacancy center, which have many applications in single-photon generation and quantum information processing.

Fabrication systems and procedures for bulk nanomachining for the realization of suspended sub-micron and nanoscale structures (e.g., nanobeam photonic and mechanical elements) in such materials are described herein. Some implementations of the fabrication procedures include steps associated with planar fabrication processes (e.g., optical or electron beam lithography and plasma etching), and also include feature that enable fabrication of suspended nanobeam structures from a starting bulk material (e.g., a single-crystal or thick film). In some examples, the fabrication procedure "carves out" suspended nanobeam elements from a given material. Some implementations of the fabrication procedure are different from some other procedures for surface nanomachining of free-standing structures in that no thin film heterolayer structure is required, and it is not necessary to perform an isotropic wet chemical etch to sacrificially remove any sub-surface layer. Instead, some implementations make use of anisotropic plasma etching to etch a bulk material from multiple angles (e.g., two slanting opposite angles, or more than two angles). In the case of two slanting opposite angles, the procedure yields suspended, triangular cross-section nanobeam photonic elements. In the case of more than two angles, various other cross-sections and resulting shapes can be achieved, as described and illustrated in more detail below.

The simultaneous anisotropic plasma etching from two or more different directions can be achieved by housing a bulk substrate within a Faraday cage electrically connected to the cathode of a parallel plate plasma etcher. During plasma etching, the Faraday cage electrically shields an interior space in which the substrate is placed from exterior electromagnetic fields. Although the Faraday cage has small grid openings on its surface, the effect of an external field is attenuated drastically within a small distance of the opening. As such, the space inside the Faraday cage remains field-free. There is a potential gradient in a reactive ion etching apparatus on the outside of the Faraday cage that accelerates ions towards the cage in a direction substantially perpendicular to the cage surface, and the electric potential that has built up over the face of the Faraday cage continues to accelerate the ions through the grid openings in a direction perpendicular to the cage surface. Once the ions move past the metal grid and into the field-free zone inside the cage, they are no longer accelerated and travel virtually unimpeded toward the substrate in the same direction. Thus, by proper physical design of the Faraday cage, the ions may be directed at the sample surface at oblique angles. Moreover, the Faraday cage may be designed to achieve anisotropic plasma etching from multiple oblique angles simultaneously. This ultimately improves fabrication throughput and opens the possibility of manufacturing unique three-dimensional optical or mechanical structures that include suspended portions whose bottom portions have been etched away by ions from multiple angles.

Anisotropic plasma etching is one example of an ion etching process that can be used to fabricate suspended devices elements without significantly impacting the final structures, or the starting high optical quality of the bulk substrate, due to etch induced crystal damage or modification. This is in contrast to certain other fabrication techniques (e.g., crystal ion-slicing or focused ion beam (FIB) milling) in which high energy ions may implant into and/or damage the substrate. Moreover, plasma etching can be used in the creation of a variety of structures (e.g., high-Q photonic crystal cavities) in a variety of materials (e.g., crystals or silicon-based materials). Additionally, the fabrication methodology described herein is compatible with advanced pattern transfer techniques, enabling million-fold device throughput and high device-to-device reproducibility.

The final suspended elements (e.g., nanobeam photonic elements) generated by the fabrication procedures range in width from sub-100 nm to several microns, for any material of interest for which there are available plasma etch protocols. The fabrication procedures are capable of producing a variety of isolated devices including simple nanobeam mechanical resonators and waveguides, a range of nanobeam photonic crystal cavity designs, and other photonic/mechanical elements, e.g., disk and ring resonators. For example, the nanobeam photonic crystal cavity designs that are possible to fabricate include "air-gap" designs, and inverted "fishbone" designs. Triangular cross-section nanobeam photonic crystal cavities in diamond have been shown to have Q-factors on the order of ~$10^6$, and wavelength scale modal volumes are possible given the triangular cross-section. A periodic dielectric structure can be created by etching regularly-spaced holes within the nanobeam waveguide, which is also possible to fabricate via the fabrication procedures described herein, for example, by including a top-down plasma etching step before the multi-angle etching within a Faraday cage.

Figure 1A:
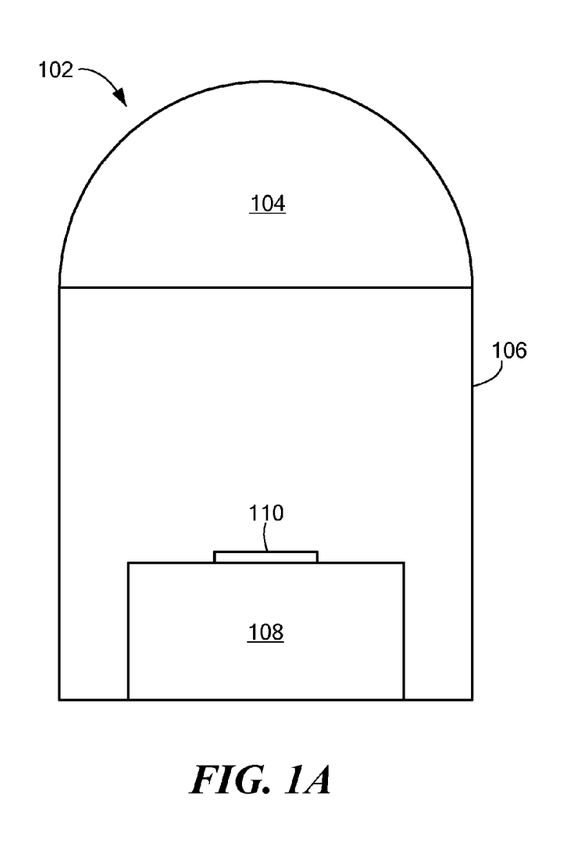
FIGS. 1A and 1B are schematic diagrams of a fabrication system.
Figure 1B:
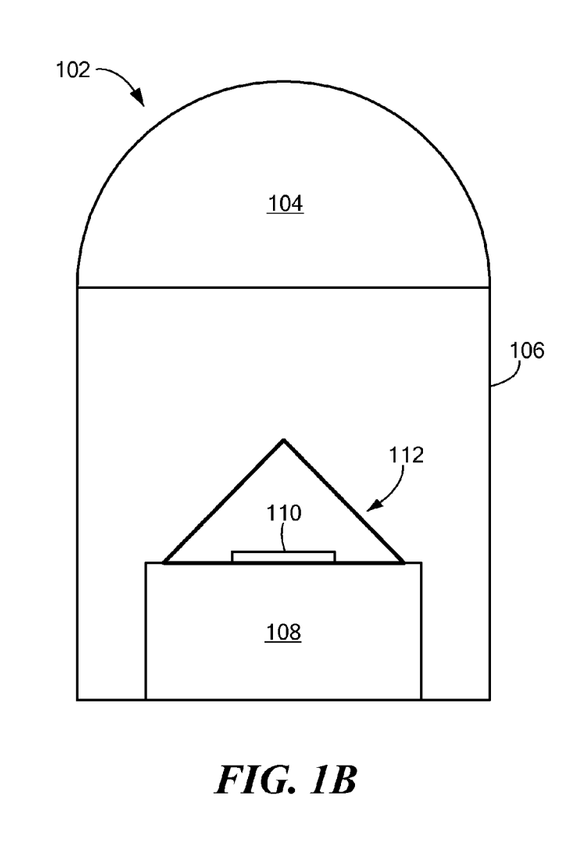

Referring to FIGS. 1A and 1B, an example of a fabrication system for performing the fabrication procedures described herein includes a plasma etch system 102, which includes a plasma source 104 and a chamber 106. Inside the chamber 106, is a sample stage 108 for supporting a sample 110. During operation, plasma ions from the plasma source 104 etch the top surface of the sample 110. In some fabrication steps, the sample 110 is enclosed in a conductive enclosure 112 supported by the sample holder 108. The conductive enclosure 112 (e.g., a Faraday cage) encloses the sample 110 all sides, including the bottom by a bottom plate, and has openings on sides above the sample holder 108 through which ions from the plasma source 104 may pass to etch the sample 110. The enclosure 112 has a geometry that is selected based on a target geometry of one or more structures to be etched in the sample 110.

The sample 110 is prepared using deposition and lithographic techniques to create a patterned etch mask on a bulk substrate (e.g., a single-crystal or other uniform material without any heterolayers). A film of a material that is eroded by the plasma etching process more slowly than the substrate material is patterned to mask selected areas on the surface of the substrate that are to be protected from the etching process. Any of a variety of microfabrication processes can be employed to deposit and pattern the etch mask. The etch mask material and thickness may be selected to provide adequate selectivity/protection in the subsequent anisotropic plasma etching. The necessary etch mask film thickness may be scaled depending on the required duration of subsequent anisotropic plasma etching steps.

Figure 2A:
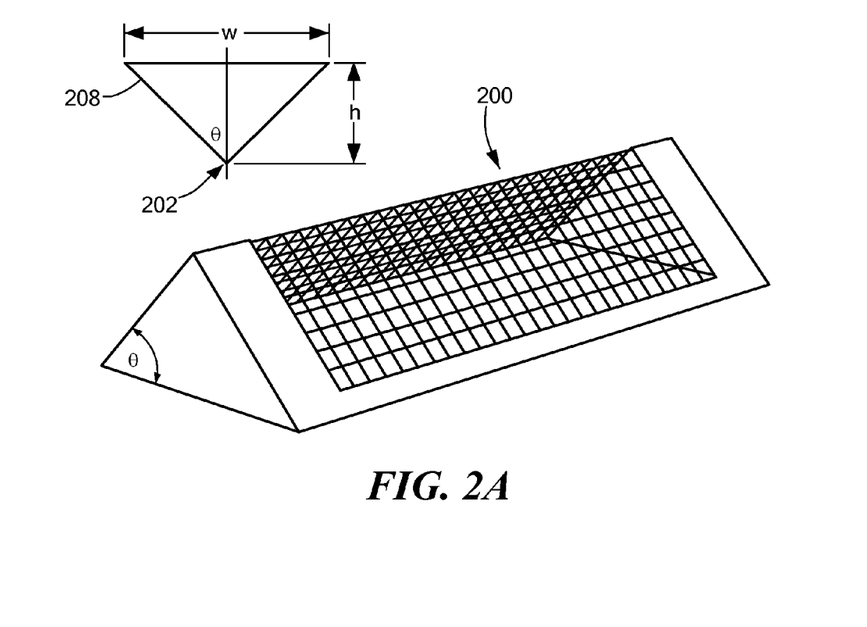
FIG. 2A is a view of a triangular Faraday cage.
Figure 2B:
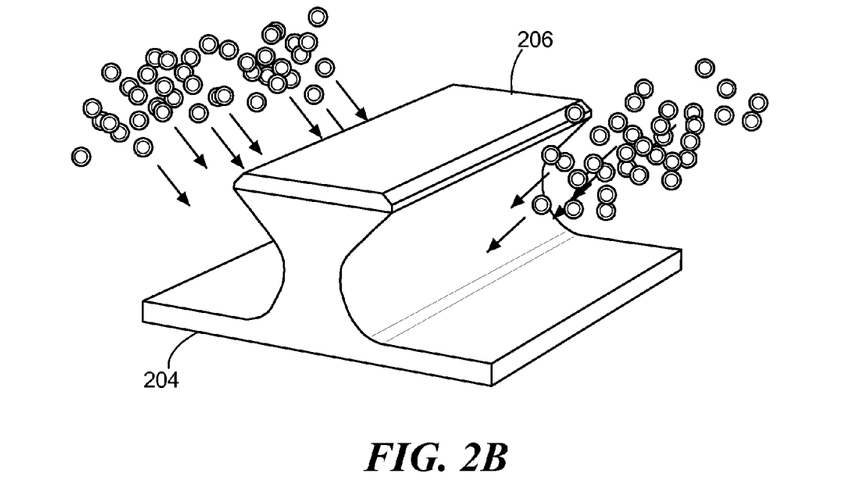
FIG. 2B is a view of ions etching a structure from two directions.

Anisotropic plasma etching can be carried out on the prepared sample 110, for example, using the following two-part process. A top-down plasma etching step is performed without the enclosure 112 to remove material in the direction substantially perpendicular to the sample surface to a desired depth. In an oblique plasma etching step, the enclosure 112 is employed to yield one or more isolated devices that include the desired suspended features (e.g., suspended nanobeam structures). In some implementations, it is helpful for at least one top-down plasma etching step to be performed before at least some of the oblique plasma etching steps to enable the separation between a suspended feature and the substrate to be tuned, as described in more detail below. An example of the enclosure 112 is a Faraday cage design, as shown schematically in FIG. 2A. The Faraday cage 200 in FIG. 2A is a triangular metallic mesh structure, which is configured to fully enclose the sample and allows the simultaneous anisotropic plasma etching from two slanting opposite angles. The incline angle θ of the Faraday cage 200 defines the ion-incident angle relative to the surface normal 202. The opposing surfaces of a fabricated nanobeam structure will each be substantially parallel to the incident ions from the opposing directions, as shown in FIG. 2B, in which ions etch a portion of a substrate 204 that is not protected by a mask feature 206. As such, the angle at the bottom apex of the triangular cross-section 208 of the fabricated nanobeam structure of this example is 2θ The relationship between the width w of the nanobeam and the height h of the nanobeam is also determined by the incline angle θ, as follows:

$$\theta = \tan^{-1}\left(\frac{w}{2h}\right).$$

Referring to FIGS. 3A-3D, an example of a fabrication procedure for fabricating a straight suspended nanobeam structure includes preparing (FIG. 3A) a substrate 300 by patterning an etch mask onto the surface of the substrate 300. A planar fabrication process is used to define the etch mask, shown in this example as a strip 302 that protects the material that is to form the nanobeam. After the etch mask has been patterned, a top-down plasma etching step is performed (FIG. 3B) to etch away portions of the substrate 300 leaving a raised portion 304 between the now lower substrate surface 306 and the strip 302. After the top-down plasma etching, an oblique plasma etching step is performed (FIG. 3C) through the Faraday cage 200 to achieve a simultaneous angled etch from opposing directions (as shown in FIG. 2B) to yield a suspended nanobeam 308. After the oblique plasma etching, a selective etching is performed (FIG. 3D) to remove the residual etch mask (which may have been partially thinned during the plasma etching steps). A suspended structure fabricated using these fabrication procedures may have residual substrate protrusion 310 of the substrate material below the structure, as shown in this example, due to the structure casting a shadow in the path of the ions during the oblique plasma etching. The suspended nanobeam 308, held in place by a supporting portion of the etched structure (not shown in FIGS. 3A-3D), can be used, for example, in a device that includes a suspended waveguide having a triangular cross-section.

Figure 4A:
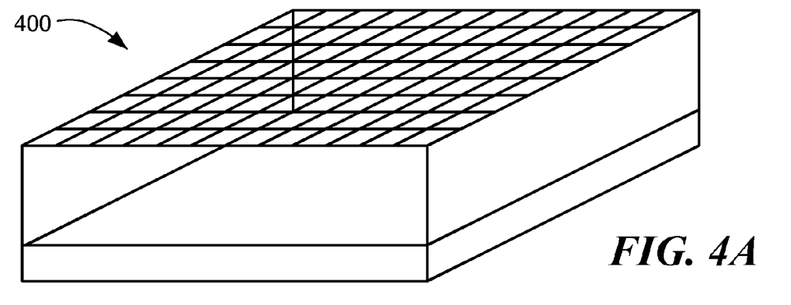
FIGS. 4A-4D are views of flat, extended triangular, pyramid, and conical Faraday cages, respectively.

Other Faraday cage designs may be implemented to realize triangular cross-section suspended nanobeams or a variety of other structures. Four examples of other Faraday cage designs are shown in FIGS. 4A-4D. A Faraday cage 400 in FIG. 4A is a flat Faraday cage structure where the enclosed sample is tilted in order to achieve anisotropic plasma etching at an oblique angle. In the case of the flat Faraday cage 400, the oblique plasma etching step is repeated a second time, with an 180° sample rotation in between, in order to achieve suspended triangular cross-section nanobeams.

Figures 3A, 3B, 3C, 3D:
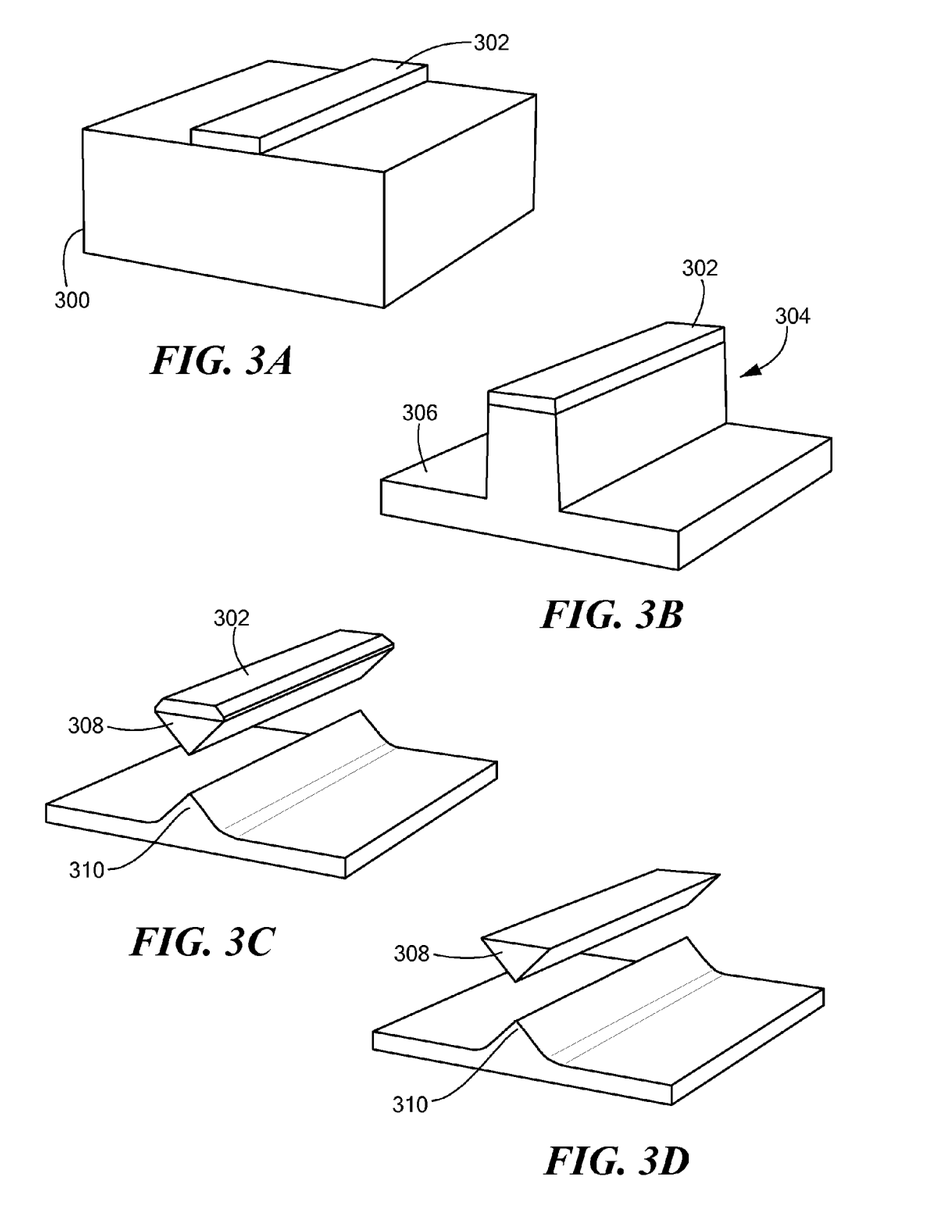
FIGS. 3A-3D are views of a fabrication process.
Figure 3E:
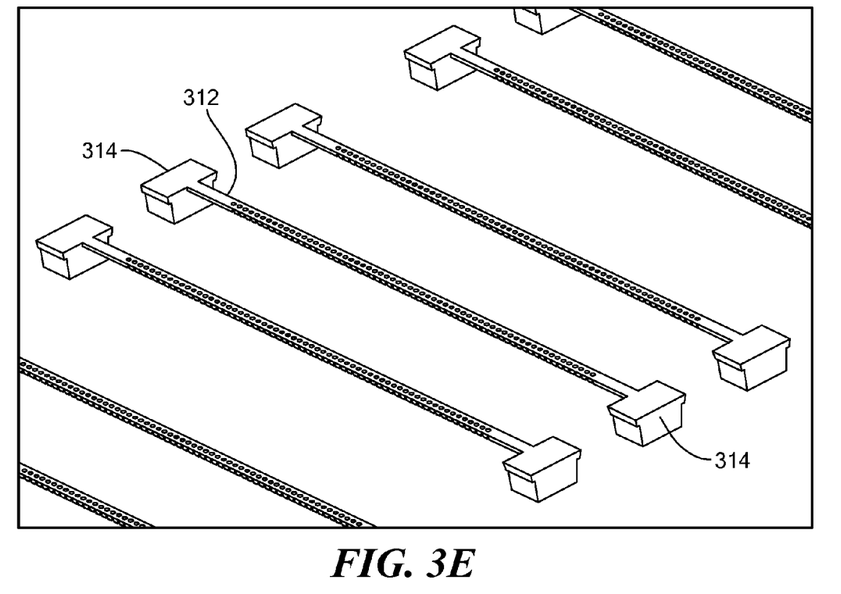
FIGS. 3E-3F are views of a suspended nanobeam photonic crystal cavity.
Figure 3F:
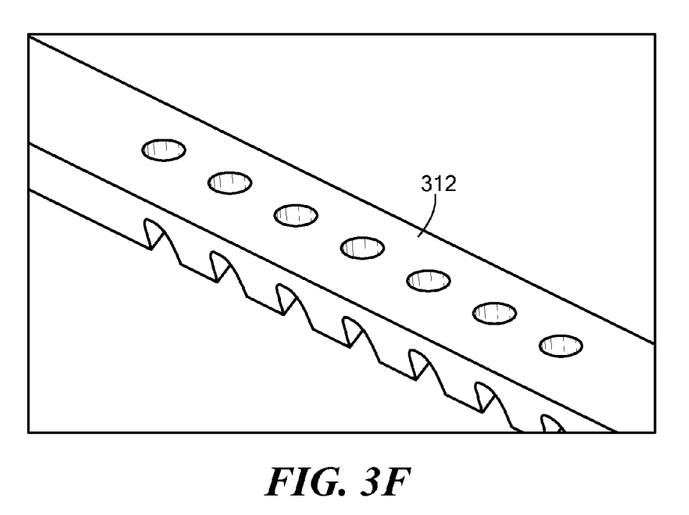
Figure 4B:
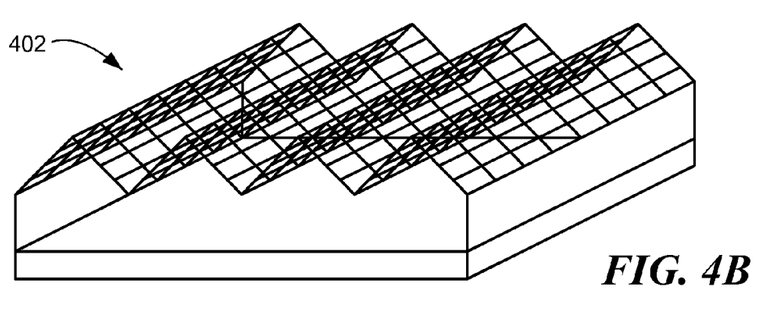

A Faraday cage 402 in FIG. 4B is an extension of the triangular Faraday cage design for larger area substrates (e.g., wafer scale fabrication). In this design, the single triangular Faraday cage 200 is replaced by an accordion structure where the triangular cage is repeated multiple times (four times in this example of cage 402). Such a Faraday cage design allows for simultaneous anisotropic plasma etching from two oblique angles across a larger area than the single triangular Faraday cage 200. For example, FIG. 3E show examples of devices consisting of a suspended nanobeam 312 supported by pedestals 314 on either side, which could be fabricated with a large number of isolated devices being repeated over a large area using a similar fabrication procedure as described with reference to FIGS. 3A-3D, and using the extended triangular Faraday cage 402. In this example, there is also an additional feature defined by the etch mask used for both plasma etching steps. In particular, the etch mask includes holes regularly distributed along the strip defining the beam, which yields (FIG. 3F) a suspended nanobeam structure 312 having a triangular cross-section with holes distributed along the structure to define a photonic crystal cavity.

Figure 4C:
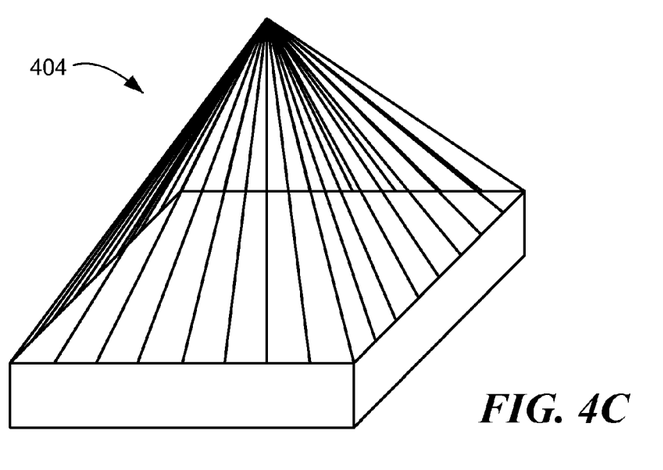
Figure 4D:
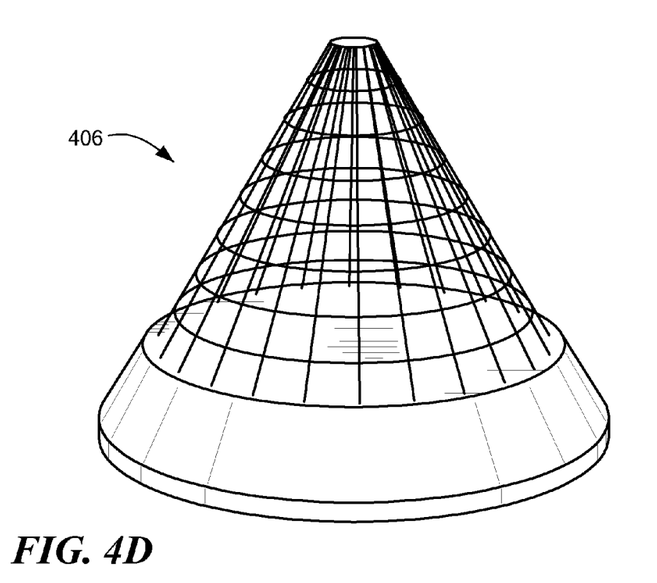
Figure 4E:
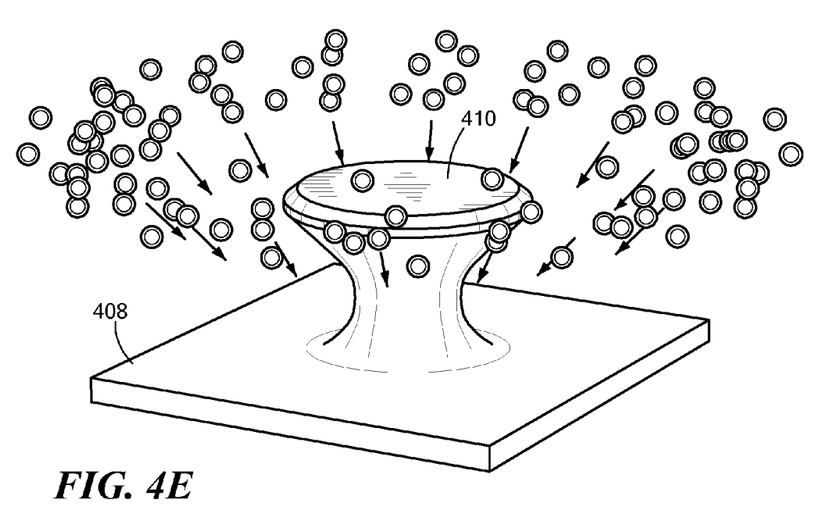
FIG. 4E is a view of ions etching a structure from distributed directions.

A Faraday cage 404 in FIG. 4C is a square base pyramid Faraday cage, which allows for simultaneous anisotropic plasma etching with ions coming from four oblique angles, to fabricate various structures such as orthogonal suspended triangular cross-section nanobeams. Other pyramid geometries are possible with a polygonal base and triangular sides formed by each base edge and a common apex. A Faraday cage 406 in FIG. 4D is a conical Faraday cage, which enables anisotropic plasma etching at an angle defined by the cone height and radius, with ions incident from different directions distributed 360° around the sample, as shown in FIG. 4E, in which ions etch a portion of a substrate 408 that is not protected by a mask feature 410. Such a Faraday cage is capable of generating micron and nanoscale disk and ring resonators and curved nanobeam structures, for example, as described and illustrated below.

The material chosen for the enclosure's mesh sides, bottom plate, and any solid side plates (e.g., the triangular end plates of Faraday cage 200) is conductive and also is able to withstand the plasma etch environment throughout the duration of the etching process. The specific dimensions and angle θ of mesh sides of the enclosure are selected to be compatible with the specific plasma etching system and nanobeam photonic structure design. The mesh parameters (including, e.g., grid wire, opening size, and pitch) are also chosen in accordance with the plasma etch parameters such that the electric field is attenuated within the enclosure and the potential gradient, which accelerates ions, builds up perpendicularly to the enclosure's surfaces. The placement of the sample within the enclosure is selected such as to yield satisfactory final suspended nanobeam structures. In the case of the triangular Faraday cage 200, for example, the sample may also be mounted at a slight angle inside the cage in order to yield a suspended nanobeam with a scalene triangular cross-section.

The top-down plasma etching step is optional in some implementations of the fabrication procedure, but may be included to accomplish certain goals, such as one or both of the following: (1) when the required etch mask thickness is equal to or larger than the width of an internal air gap divided by the tangent of the incident ion angle in the subsequent oblique plasma etching step, the top-down etch is used to properly define the air gaps in the final suspended nanobeam; (2) in situations where the etch mask has poor or moderate selectivity given the plasma etch conditions and/or a larger physical clearance is required between the bottom of the suspended nanobeam and the substrate material beneath, the top-down etch is used to increase the final separation between substrate and nanobeam. For such goals, the top-down plasma etching step is performed before the oblique plasma etching step. The combination of at least one initial top-down plasma etching step and at least one subsequent oblique plasma etching step (using the same etch mask) facilitates fabricating device structures that are isolated from other structures fabricated in the substrate. The top-down plasma etching may facilitate deeper etching than the oblique plasma etching since it may not erode the etch mask as fast as the oblique plasma etching.

For example, FIGS. 5A-5E show examples of various isolated structures. In these examples, portions of the structures are isolated from any of the material of the substrate between that portion of the structure and the lowest surface of the etched substrate. This separation can be tuned using a combination of the top-down plasma etching step (e.g., coarse tuning), and the oblique plasma etching step (e.g., fine tuning). For example, an isolated portion of a structure may be isolated, over a particular plane, by more than twice the minimum diameter of the cross-section of that portion in that particular plane (e.g., isolated by more than five times, or by more than ten times).

The anisotropic plasma etching parameters used do not necessarily have to be the same for the top-down and oblique etching steps, but can be selected to ensure the ability to sufficiently etch the substrate material. Various etching techniques including plasma etching, reactive ion etching, high density plasma etching (e.g., using inductively coupled plasmas), and sputter etching are all acceptable processes within different implementations of the fabrication procedures. As well, neither etching step is necessarily required to be performed in a continuous process in all implementations, and the etching may be interrupted in order to remove non-volatile plasma etching by-products by wet chemical etching or any other procedure.

Following the etching, the residual etch mask material may be removed by any suitable process, such as wet-etching, acid cleaning, or reactive ion etching. Removal of the residual etch mask may not be necessary for all device designs. For example, for devices fabricated using a $SiO_2$ mask to form a diamond waveguide, the $SiO_2$ would not necessarily have to be removed for the waveguide to function. In some cases, the residual etch mask may even aid performance.

Figure 5A:
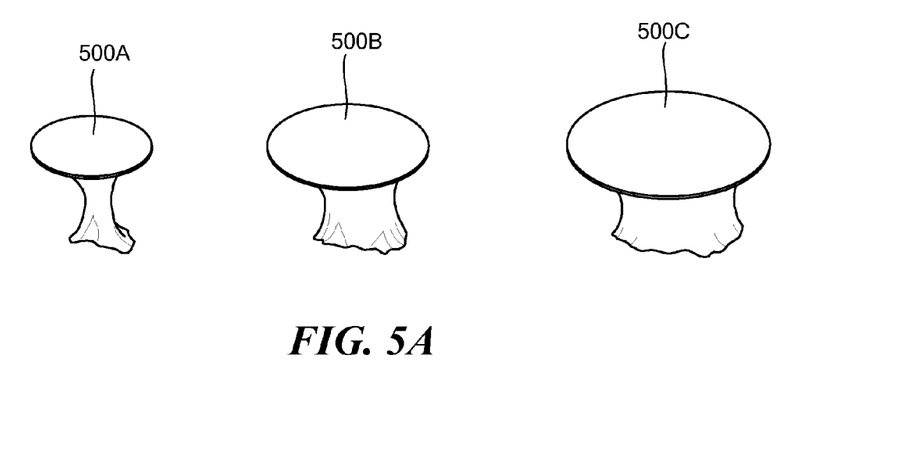
FIGS. 5A-5E are views of disk, ring, curved nanobeam, spiral nanobeam, and cantilever nanobeam structures, respectively.
Figure 5B:
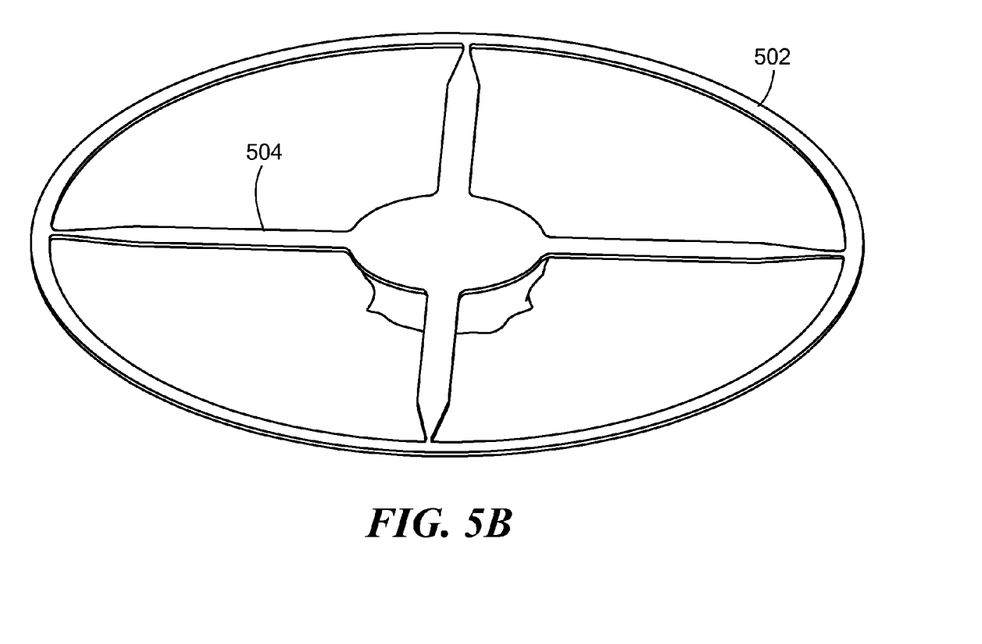
Figure 5C:
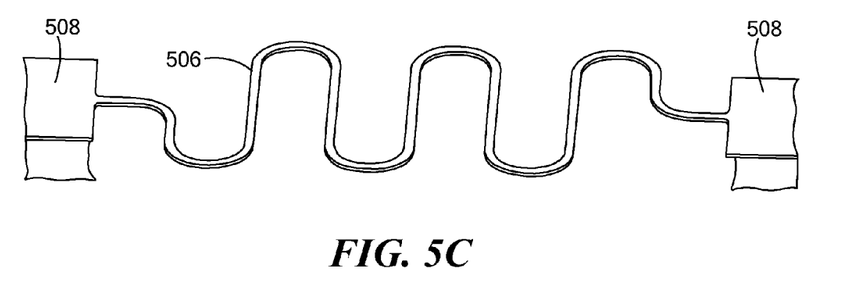
Figure 5D:
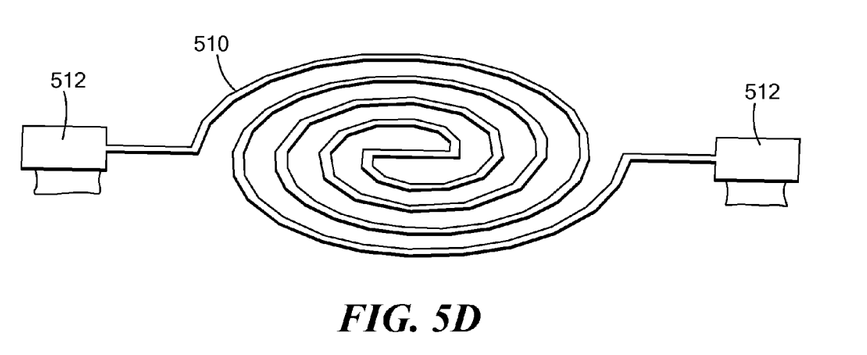
Figure 5E:
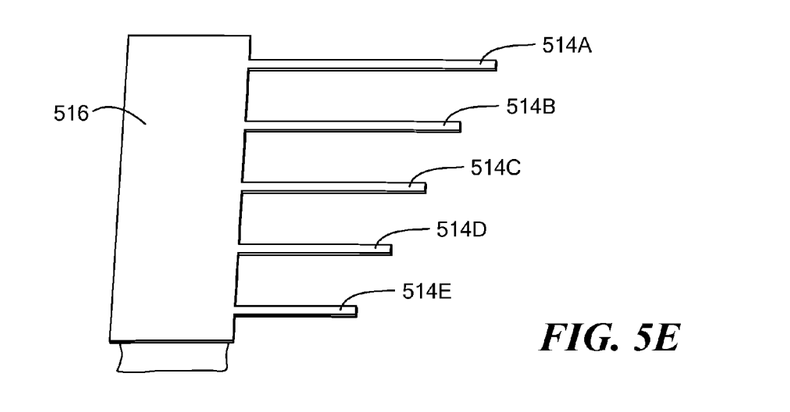

Additional examples of suspended nanobeam waveguides and cavities are shown in FIGS. 5A-5E. FIG. 5A shows suspended disk resonator structures 500A-500C with different diameters, supported on cylindrical pedestals. FIG. 5B shows a ring resonator structure 502 suspended by a support structure 504. FIG. 5C shows a curved nanobeam structure 506 suspended by pedestals 508 on either side. FIG. 5D shows a spiral nanobeam structure 510 suspended by pedestals 512 on either side. FIG. 5E shows a set of cantilever nanobeams 514A-514E suspended on one end by a support platform 516. Each of the structures in FIGS. 5A-5E can be fabricated using a conical Faraday cage design, as shown in FIG. 4D.

It is to be understood that the foregoing description is intended to illustrate and not to limit the scope of the invention, which is defined by the scope of the appended claims. Other embodiments are within the scope of the following claims.

What is claimed is:

1. A method comprising:
    forming an etch mask on a substrate;
    etching the substrate through the etch mask from at least a first direction having a first angle relative to a surface of the substrate, including removing a first portion of the substrate;
    positioning the substrate in an enclosure configured to shield an interior of the enclosure from electromagnetic fields exterior to the enclosure; and
    etching the substrate in the enclosure through the etch mask from at least a second direction having a second angle, different from the first angle, relative to the surface of the substrate, including removing a second portion of the substrate to form a structure having at least a first portion of the structure suspended over the substrate.

2. The method of claim 1, wherein the enclosure is a Faraday cage.

3. The method of claim 1, wherein etching the substrate in the enclosure includes performing an anisotropic plasma etch of the substrate.

4. The method of claim 3, wherein etching the substrate in the enclosure includes performing the anisotropic plasma etch from at least a third direction having a third angle relative to the surface of the substrate.

5. The method of claim 4, wherein the second angle and the third angle are defined by a geometry of the enclosure.

6. The method of claim 4, wherein the second direction is different from the third direction, and the second angle is approximately equal to the third angle.

7. The method of claim 3, wherein the anisotropic plasma etch includes at least one of a plasma etch, a reactive ion etch, a high density plasma etch, and a sputter etch.

8. The method of claim 1, wherein etching the substrate through the etch mask from at least the first direction includes performing a top-down plasma etching to pattern the substrate with a pattern defined by the etch mask.

9. The method of claim 8, wherein etching the substrate in the enclosure through the etch mask from at least the second direction includes etching the patterned substrate in the enclosure.

10. The method of claim 8, wherein the second angle relative to the surface of the substrate is selected to form, in a portion of the first portion of the structure, a shape having a triangular cross-section with an apex directed toward the substrate.

11. The method of claim 1, wherein a dimension of the first portion of the structure is at least about 10 nm.

12. The method of claim 1, wherein the structure includes at least one of a mechanical resonator, an optical resonator, an optical waveguide, and a photonic crystal.

13. The method of claim 1, wherein the substrate includes at least one of a single crystal bulk substrate, a polycrystalline substrate, and an amorphous substrate.

14. The method of claim 13, wherein the substrate is a film having a thickness greater than a thickness of the structure.

15. The method of claim 13, wherein the substrate is diamond.

16. The method of claim 1, further comprising removing the etch mask.

17. A fabrication system comprising:
    a plasma etch system;
    a conductive enclosure configured to shield an interior of the enclosure from electromagnetic fields exterior to the enclosure; and
    a sample holder disposed within the enclosure, the plasma etch system configured to etch a sample positioned on the sample holder from more than two different directions based on a geometry of the enclosure.

18. The fabrication system of claim 17, wherein the enclosure is a Faraday cage.

19. The fabrication system of claim 17, wherein the enclosure is electrically connected to a cathode of the plasma etch system.

20. The fabrication system of claim 17, wherein the plasma etch system includes at least one of a plasma etcher, a reactive ion etcher, a high density plasma etcher, and a sputter etcher.

21. The fabrication system of claim 17, wherein the enclosure is formed from a material capable of withstanding etch conditions of the plasma etch system.

22. The fabrication system of claim 17, wherein the geometry of the enclosure is selected based on a target geometry of a structure to be etched in the sample.

23. The fabrication system of claim 17, wherein the geometry of the enclosure is a pyramid having a polygonal base and triangular sides formed by each base edge and a common apex.

24. The fabrication system of claim 17, wherein the geometry of the enclosure is conical.

* * * * *